United States Patent

Straemke

[11] Patent Number: 5,828,175
[45] Date of Patent: Oct. 27, 1998

[54] CIRCUITRY FOR OPERATING A GLOW DISCHARGE PATH

[76] Inventor: Siegfried Straemke, Fichtenhain 6, 52538 Selfkant, Germany

[21] Appl. No.: 764,724

[22] Filed: Dec. 10, 1996

[30] Foreign Application Priority Data

Dec. 29, 1995 [DE] Germany ............ 295 20 685 U

[51] Int. Cl.$^6$ ................ H01J 7/30; B23K 9/06
[52] U.S. Cl. ............ 315/111.21; 315/123; 315/226; 219/69.18; 219/130.4; 219/121.57
[58] Field of Search ............ 315/111.21, 227 A, 315/227 R, 216, 226, 123; 313/231.31; 219/130.4, 121.57, 121.54, 69.18

[56] References Cited

U.S. PATENT DOCUMENTS 3,558,998  1/1971  Bertolasi ............... 315/227
4,645,981  2/1987  Strämke ............... 315/227 R

*Primary Examiner*—Arnold Kinkead
*Attorney, Agent, or Firm*—Diller, Ramik & Wight, PC

[57] ABSTRACT

The circuitry for operating a glow discharge path (GES) comprises a bridge circuit (BC) comprising a polarity switch (S1) and an ignition pulse circuit (ZIS1) in a first bridge branch (B1) and a polarity switch (S2) and an ignition pulse circuit (ZIS2) in a second bridge branch (B2). The glow discharge path (GES) formed between two electrodes (E1, E2) is located in the transverse branch of the bridge circuit (BC). For changing the polarity of the glow discharge path (GES), the polarity switch (S1) of the one bridge branch (B1) can be operated together with the ignition pulse circuit (ZIS2) of the other bridge branch (B2). Thus, each of the two electrodes (E1, E2) of the glow discharge path (GES) can be used as a cathode. The cathode of the glow discharge path is cleaned by the impinging ions.

5 Claims, 2 Drawing Sheets

CIRCUITRY FOR OPERATING A GLOW DISCHARGE PATH

BACKGROUND OF THE INVENTION

The present invention relates to a circuitry for operating a glow discharge path, comprising two electrodes forming the glow discharge path and an ignition pulse circuit supplying voltage pulses each having a pulse peak and subsequently a portion of an amplitude sufficient for maintaining the glow discharge.

Such a circuitry is known from U.S. Pat. No. 4,645,981. In the starting portion of each pulse, this circuitry supplies a pulse peak which is higher than the ignition voltage of the glow discharge. When the glow discharge is ignited with this transient pulse peak, it is maintained by a voltage of lower amplitude in the further course of the voltage pulse. Due to this lower voltage which may be below the ignition voltage of the glow discharge path, discharges of lower specific power become possible, which can be controlled well.

Glow discharges are often used for the surface treatment of workpieces. In the course of this, the one electrode is connected to the workpiece and the other electrode to the wall of a reactor surrounding the workpiece or with a counterelectrode located in the reactor. During the glow discharge, that electrode which is connected as a cathode is bombarded with ions from the discharge plasma and cleaned thereby, i.e., freed from foreign deposits. Such foreign deposits may occur on both the workpiece and the counterelectrode. They may be formed by vapor deposits of foreign matter located at the workpiece or contained in pores of the workpiece, which is vaporized during the glow discharge. As a rule, the workpieces are connected as a cathode, so that the workpiece surface is cleaned during the glow discharge.

SUMMARY OF THE INVENTION

It is an object of the present invention to provide a circuitry for operating a discharge path, which permits a cleaning of both the workpiece surface and the counter electrode without reconnection of the electrodes (workpiece and counterelectrode) being required.

The circuitry according to the invention includes a bridge circuit including a polarity switch and an ignition pulse circuit in each bridge branch. The glow discharge path is contained in the transverse branch of the bridge circuit. Each ignition pulse circuit is controlled to supply voltage pulses if the polarity switch allocated thereto and located in the other bridge branch is in the conducting state. Of the two polarity switches, one is always conducting and one is non-conducting, i.e., the polarity switches are alternately switched on. That ignition pulse circuit diagonally opposite the conducting polarity switch in the bridge circuit is controlled to generate the voltage pulses. By switching the polarity switches and controlling the associated ignition pulse circuit, it is achieved that each of the two electrodes can optionally be operated as a cathode or as an anode. Thus, it is possible to optionally clean either the one or the other electrode during the glow discharge. To this end, no reconnection of the electrodes is required. The cleaning is effected by a suitable control of the switches included in the bridge circuit by means of an appropriate controller comprising a control switch by which it can be determined which one of the electrodes forms the cathode and which one the anode during the glow discharge.

It is a particular advantage that the ignition pulse circuit respectively supplies transient pulse peaks which rise above the ignition voltage of the glow discharge path and then change into voltage pulses of lower amplitude. If only voltage pulses (without pulse peaks) would change polarity during a polarity change, another ignition and operating voltage would possibly have to be chosen for each polarization state, since the two electrodes may have different areas and different surface shapes. An electrode with pointed contours ignites more easily than an electrode with flat contours. Moreover, the temperature of the respective electrode affects the ignition behavior. As a result of the use of voltage pulses with superimposed transient pulse peaks, the polarity change can be performed without any change of the operating voltage, a safe ignition without the risk of voltage spark-over being ensured.

Advantageous developments and implementations of the invention are to be taken from the following description of an embodiment thereof as well as the subclaims.

BRIEF DESCRIPTION OF THE DRAWINGS

Hereinafter, an embodiment of the invention is explained in detail with reference to the drawings, in which.

DESCRIPTION OF THE PREFERRED EMBODIMENT

Figure 1:
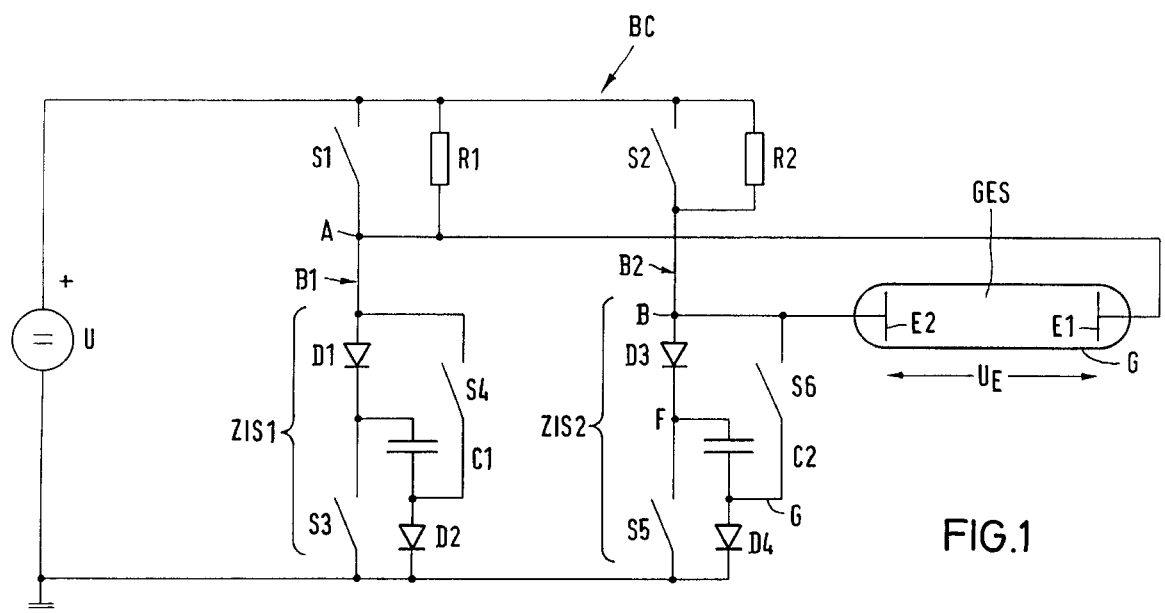
FIG. 1 is a schematic circuit diagram of the circuitry for operating a glow discharge path.

The circuitry illustrated in FIG. 1 comprises a d.c. voltage source U whose positive terminal supplies positive potential, whereas the negative terminal is connected to mass potential. The d.c. voltage source U is connected to a bridge circuit BC whose first bridge branch B1 includes the following components in series: a polarity switch S1, a first diode D1, and a switch S3. The switch S3 is bridged by a series connection of a capacitor C1 and a second diode D2 having its cathode connected to mass potential. The node A connecting the polarity switch S1 to the diode D1 is connected to the anode of the diode D2 via a switch S4. The polarity switch S1 is bridged by a resistor R1.

The second bridge branch B2 of the bridge circuit BC is similarly configured, and its components have the same dimensions as the bridge branch B1. The polarity switch S2 is connected in series with a first diode D3 and a switch S5 to the voltage source U. The switch S5 is bridged by a series connection of a capacitor C2 and a second diode D4. The connection point B of the switch S2 and the diode D3 is connected to the anode of the diode D4 via a switch S6. The polarity switch S2 is bridged by a resistor R2.

That portion of the bridge branch B1 located between the connection point A and the mass potential forms an ignition pulse circuit ZIS1, and that portion of the second bridge branch B2 located between the connection point B and the mass potential forms the ignition pulse circuit ZIS2.

The transverse branch of the bridge circuit including a glow discharge path GES extends between the connection points A and B. The glow discharge path GES is formed by two electrodes E1 and E2, the electrode E1 being connected to the connection point A and the electrode E2 being connected to the connection point B. The glow discharge path GES is located in the interior of an evacuated container G which may be a reactor connected to a vacuum pump.

All of the switches S1–S6 are electronic switches controlled by a controller (not shown).

The polarity switches S1 and S2 are controlled such that only one of these switches is in the conducting state at a time. It is to be assumed that the polarity switch S1 is conducting, while the polarity switch S2 is non-conducting. Then, the positive potential is applied to the electrode E1 and initially, to the electrode E2 as well (via the resistor R2), so that the voltage $U_E$ between the electrodes of the glow discharge path GES is zero. When the polarity switch S1 is conducting, only the switches S5 and S6 of the ignition pulse circuit ZIS2 are controlled in the manner described hereinafter, while the switches S3 and S4 of the ignition pulse circuit ZIS1 remain in the non-conducting state as does the polarity switch S2.

Figure 2:
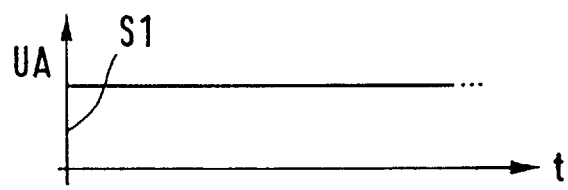
FIG. 2 shows the pulse courses at selected nodes of the circuit according to FIG. 1.
Figure 2:
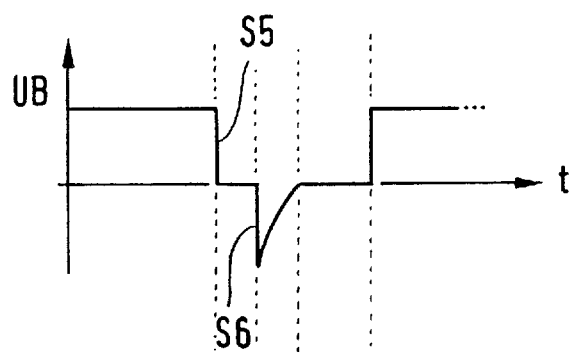
Figure 2:
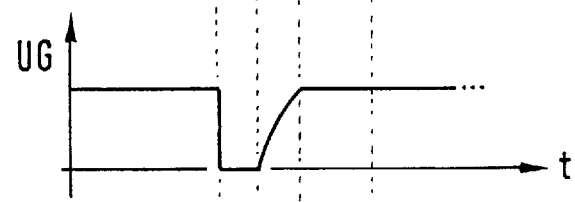
Figure 2:
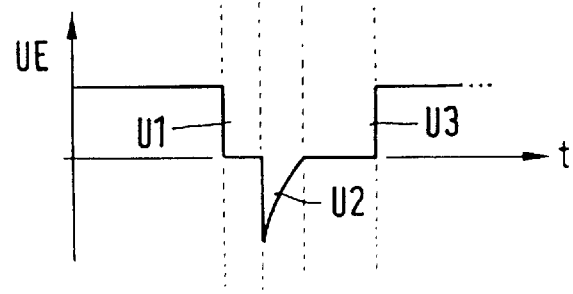

In FIG. 2, the voltage courses $U_A$ at the connection point A, $U_B$ at the connection point B, $U_G$ at the connection point G of the switch S6 and the diode D4, and the voltage course $U_E$ at the glow discharge path GES are illustrated. With the polarity switch S1 being in the conducting state, the switch S5 is switched into the conducting state, whereby the voltage $U_B$ drops to mass potential. Since the capacitor C2 maintains its charge, the voltage $U_G$ at point G drops to a value which is more negative than mass potential.

When switch S6 is subsequently switched into the conducting state as well, the capacitor C2 discharges so that the voltage $U_G$ rises to mass potential. At the same time, a negative voltage peak, which is more negative than mass potential, occurs at connection point B during the discharge process.

From these voltage courses, the voltage course $U_E$ at the glow discharge path GES shown in FIG. 2 results. The voltage pulses of the voltage $U_E$ have a portion U1 in which the amplitude corresponds to that of the supply voltage U, followed by a voltage peak U2 based on the discharge of the capacitor C2, and subsequently a portion U3 having the amplitude of the supply voltage U again. The pulse peak U2 serves to ignite a glow discharge between the electrodes E1 and E2, whereas the voltage is dimensioned such in portion U3 that it only serves to maintain the glow discharge. The voltage pulses can be superimposed on a variable or a fixed base voltage.

With the polarity as described, the electrode E1 is operated as an anode and the electrode E2 as a cathode. During the glow discharge, the electrode E2 is cleaned thereby. If, however, the electrode E1 is to be cleaned, the polarity switch S1 is driven into the non-conductive state and the polarity switch S2 into the conductive state. The ignition pulse generation is effected with the ignition pulse circuit ZIS1.

The supply voltage U amounts to between 200 and 2000 V and is adjustable. The duration of the voltage pulses is variable between 0.1 and $10^6$ $\mu s$, at a pulse repetition time of from 0.1 to $10^6$ $\mu s$. Further, individual pulses can be generated.

The circuitry according to the invention can be used for all kinds of glow discharges, preferably with the processing of workpieces in a glow discharge reactor, preferably with the PVD or CVD deposition, during plasma nitrogenation, plasma carbon deposition, plasma boronation, plasma cleaning, surface modification, e.g., the treatment of organic and inorganic matter, and in the plasma chemistry as well as in many other plasma processes. During the plasma treatment of workpieces, the one electrode can be connected to the workpiece and the other one to the container G. It is also possible to operate the discharge between additionally interposed electrodes, e.g., grids, or between them and the wall and the workpiece, respectively.

What is claimed is:

1. A circuit for operating a glow discharge path (GES), comprising two electrodes (E1, E2) forming the glow discharge path and an ignition pulse circuit (ZIS1, ZIS2) supplying voltage pulses each having a pulse peak (U2) and subsequently a portion (U3) with an amplitude sufficient for maintaining the glow discharge, a bridge circuit (BC) having branches including a polarity switch (S1, S2) and an ignition pulse circuit (ZIS1, ZIS2) in each branch thereof, a glow discharge path (GES) in one branch of the bridge circuit (BC), each ignition pulse circuit (ZIS1, ZIS2) is controlled to supply voltage pulses when the polarity switch (S1, S2) allocated thereto and located in another branch is in a conducting state, and each polarity switch (S1, S2) has a resistor (R1, R2) connected in parallel thereto.

2. The circuit for operating a glow discharge path according to claim 1, wherein each ignition pulse circuit (ZIS1, ZIS2) comprises a first switch (S3, S5) arranged in series with a first diode (D1, D3), a series connection of a capacitor (C1, C2) and a second diode (D2, D4) bridging the first switch, and a switch (S4, S6) connecting the second diode to one of the electrodes (E2).

3. The circuit for operating a glow discharge path according to claim 1, wherein an operating voltage (U) of the bridge circuit (BC) is variable in a range of from 200 to 2000 V.

4. The circuit for operating a glow discharge path according to claim 1, wherein the duration of the voltage pulses is variable in a range of from 0.1 to $10^6$ $\mu s$.

5. The circuit for operating a glow discharge path according to claim 1, wherein the voltage pulses are superimposed on a variable or a fixed base voltage.

* * * * *